(12) United States Patent
Chan et al.

(10) Patent No.: US 7,999,192 B2
(45) Date of Patent: Aug. 16, 2011

(54) ADJACENT PLATED THROUGH HOLES WITH STAGGERED COUPLINGS FOR CROSSTALK REDUCTION IN HIGH SPEED PRINTED CIRCUIT BOARDS

(75) Inventors: Jason Edward Chan, Nashua, NH (US); Jose Ricardo Paniagua, New Market, NH (US)

(73) Assignee: Amphenol Corporation, Wallingford, CT (US)

( * ) Notice: Subject to any disclaimer, the term of this patent is extended or adjusted under 35 U.S.C. 154(b) by 1110 days.

(21) Appl. No.: 11/717,634

(22) Filed: Mar. 14, 2007

(65) Prior Publication Data

US 2008/0227311 A1    Sep. 18, 2008

(51) Int. Cl.
*H05K 1/11* (2006.01)
(52) U.S. Cl. ........................ 174/262; 361/785
(58) Field of Classification Search .......... 174/262–266; 361/785–791, 803
See application file for complete search history.

(56) References Cited

U.S. PATENT DOCUMENTS

| | | | |
|---|---|---|---|
| 3,193,789 A | 7/1965 | Brown et al. |
| 3,243,498 A | 3/1966 | Allen et al. |
| 3,568,000 A | 3/1971 | D'Aboville et al. |
| 4,494,083 A | 1/1985 | Josefsson et al. |
| 4,598,470 A | 7/1986 | Dougherty, Jr. et al. |
| 4,668,332 A | 5/1987 | Ohnuki et al. |
| 4,787,853 A | 11/1988 | Igarashi |
| 4,859,806 A | 8/1989 | Smith |
| 4,906,198 A | 3/1990 | Cosimano et al. |
| 4,949,163 A | 8/1990 | Sudo et al. |
| 5,038,252 A | 8/1991 | Johnson |
| 5,118,300 A | 6/1992 | Zarreii |
| 5,266,912 A | 11/1993 | Kledzik |
| 5,399,104 A | 3/1995 | Middlehurst et al. |
| 5,487,218 A | 1/1996 | Bhatt et al. |
| 5,568,107 A | 10/1996 | Buuck et al. |
| 5,689,216 A | 11/1997 | Sturdivant |
| 5,718,606 A | 2/1998 | Rigby et al. |
| 5,961,349 A | 10/1999 | Paagman |

(Continued)

FOREIGN PATENT DOCUMENTS

EP        0165575 A2    12/1985

(Continued)

OTHER PUBLICATIONS

Patel, Gautam et al., Designing 3.125 Gbps Backplane Systems, Teradyne Slide Presentation, 2002, Teradyne, Inc., Nashua, NH, U.S.A., 58 pages.

(Continued)

*Primary Examiner* — Jeremy Norris
(74) *Attorney, Agent, or Firm* — Blank Rome LLP

(57) ABSTRACT

An electrical signal connection, an electrical signaling system, and a method of connecting printed circuit boards. The electrical signal connection having a first conductive via and a second conductive via disposed in a first printed circuit board. A first conductive trace with a first end and a second end has the first end electrically coupled to the first conductive via at a first distance from the top surface of the first printed circuit board. The second end of the first conductive via is electrically coupled to the second printed circuit board. A second conductive trace with a first end and a second end has the first end being electrically coupled to the second conductive via at a second distance from the top surface of the first printed circuit board. The second end being is electrically coupled to the second printed circuit board.

32 Claims, 7 Drawing Sheets

U.S. PATENT DOCUMENTS

| | | | |
|---|---|---|---|
| 6,137,064 | A | 10/2000 | Kiani et al. |
| 6,181,219 | B1 | 1/2001 | Gailus et al. |
| 6,388,208 | B1 | 5/2002 | Kiani et al. |
| 6,392,160 | B1 * | 5/2002 | Andry et al. .................. 174/261 |
| 6,541,712 | B1 | 4/2003 | Gately et al. |
| 6,593,535 | B2 | 7/2003 | Gailus |
| 6,603,079 | B2 * | 8/2003 | Biron ............................ 174/254 |
| 2004/0115968 | A1 | 6/2004 | Cohen |
| 2004/0212972 | A1 | 10/2004 | Khilchenko et al. |
| 2005/0029013 | A1 * | 2/2005 | Lee ............................... 174/262 |

FOREIGN PATENT DOCUMENTS

| | | | |
|---|---|---|---|
| JP | 54124965 | | 2/1953 |
| JP | 58106968 | | 7/1983 |
| JP | 60010648 | A | 1/1985 |
| JP | 60042896 | A | 3/1985 |
| JP | 62229896 | A | 10/1987 |
| JP | 62235795 | A | 10/1987 |
| JP | 2094693 | A | 4/1990 |
| JP | 2297883 | A | 12/1990 |
| JP | 4243197 | A | 8/1992 |
| JP | 0548378 | | 6/1993 |
| JP | 5160605 | A | 6/1993 |
| JP | 5343554 | A | 12/1993 |
| JP | 6021253 | A | 1/1994 |
| JP | 613181 | | 2/1994 |
| JP | 6084571 | A | 3/1994 |
| JP | 6338687 | A | 12/1994 |
| JP | 8139503 | A | 5/1996 |
| JP | 9293599 | A | 11/1997 |
| JP | 9321433 | A | 12/1997 |
| JP | 10229262 | A | 8/1998 |
| WO | 8505529 | A1 | 12/1985 |

OTHER PUBLICATIONS

Cohen, Tom, Practical Guidelines for the Implementtion of Back Drilling Plated Through Hole Vias in Multi-gigabit Board Applications, DesignCon 2003, 2003, Teradyne, Inc., Nashua, NH, U.S.A., 10 pages.

Gneiting, Thomas, et al., Investigating Microvia Technology for 10 Gbps and Higher Telecommunications Systems, DesignCon 2005 White Paper, Feb. 2005, Agilent Technologies, Inc., U.S.A., pp. 1-26.

Bogatin, Eric, Signal Integrity—Simplified, Professional Technical Reference, 2004, pp. 443-445, Prentice Hall, Upper Saddle River, NJ, US.

Clink Dr., James, Maximizing 10Gbps Transmission Path Length in Copper Backplanes with and without Transceiver Technology, DesignCon 2003, 2003, pp. 11-12 and 15-16 of 23, Winchester Electronics, Wallingford, CT, US.

Clink Dr., James et al., Crosstalk in 10Gbps Serial Channels: Optimizing the forgotten component, DesignCon 2004, 2004, 11 pages, Winchester Electronics, Wallingford, CT, US.

* cited by examiner

ADJACENT PLATED THROUGH HOLES WITH STAGGERED COUPLINGS FOR CROSSTALK REDUCTION IN HIGH SPEED PRINTED CIRCUIT BOARDS

FIELD OF THE INVENTION

The present invention relates generally to the field of signaling systems for transmitting information over wires with connectors for printed circuit boards. In particular, the present invention relates to a signaling system in which traces are used to connect printed circuit boards and crosstalk is minimized between adjacent traces.

BACKGROUND OF THE INVENTION

The proliferation of many new high-speed digital standards is increasingly testing the limits of transmitting a signal. Data must be transmitted with very few bit errors to maintain system reliability. However, system integrity suffers as the risetime of data transitioning from a zero to a one becomes faster. Faster risetimes amplify the effects of poor design of any component found in any physical layer in a system. Faster risetimes mean components must be able to operate at higher frequencies and mitigate frequency dependent effects which are now common in high-speed digital designs. Frequency effects must be considered in designing signal connections.

One often encountered problem is coupling between two signal conductors. Two signal conductors can be electromagnetically coupled by signals carried on each signal conductor. As the signals propagate down the two signal conductors, the signal encounters an impedance due to coupling. If there were no coupling between the signal conductors, the impedance of each signal conductor would be dependent on only the parameters of that particular signal conductor. Further, the impedance of one signal conductor is dependent on the frequency of the signal. However, due to coupling, the impedance on one signal conductor may be dependent on the signal and parameters of an adjacent signal conductor as well as its own signal and parameters. The coupling is also known as crosstalk, which is discussed, for instance, in U.S. Pat. No. 7,108,556.

In some applications, such as printed circuit boards, a trace is used to provide a pathway for signals. The trace (sometimes called a signal trace or wire trace) is generally a conductive pathway (e.g., a line or wire) that allows for electricity to pass from one element to another. The trace that is used to connect conductive vias on either end constitutes what is generally referred to as a "channel" as described in J. Clink and C. Flaherty in "Crosstalk in 10 Gbps Serial Channels: Optimizing the Forgotten Component," DesignCon 2004, Santa Clara, Calif.; and by J. Clink in "Maximizing 10-Gbps Transmission Path Length in Copper Backplanes With and Without Transceiver Technology," DesignCon 2003, Santa Clara, Calif.; Vias can extend through the printed circuit board. Adjacent vias can be differential pair plated-through-holes. Adjacent differential pair vias are often routed side-by-side from a source area to a destination area of a printed circuit board or to another printed circuit board thereby interconnecting to a separate printed circuit board. Either side can be considered the destination area or the source area. In either case, between the source area and destination area would be many parallel traces connecting adjacent differential pair channels from one side to the other. On modern printed circuit boards, differential pair traces routed in the same layer are often located within relatively close proximity to one another in a backplane. Some small amount of coupling or crosstalk may be present.

Two differential pairs sufficiently spaced apart will mitigate inter-pair crosstalk, as discussed in "Signal Integrity—Simplified" by E. Bogatin, Prentice-Hall, NL, 2004, pp. 443-444; and "Crosstalk in 10 Gbps Serial Channels: Optimizing the Forgotten Component," by J. Clink and C. Flaherty, DesignCon 2004, Santa Clara, Calif.;. However, direct electromagnetic coupling between adjacent via pairs will occur and result more severe crosstalk levels.

Adjacent differential pair vias are commonly configured as transmitter pairs routed to the same receiver area of the printed circuit board in a parallel fashion. "Designing 3.125 Gbps Backplane Systems," Electronica 2002, by G. Patel and K. Ryan, indicates that grouping transmitters and receivers along unshielded adjacent differential pair vias can reduce crosstalk in a printed circuit board channel. This routing method is commonly found in most backplanes where adjacent channels are broken out of the same layer and depth. The purpose of this routing method is primarily to gather signal lines originating from the same source and route them to the same destination, such as signal lines between a silicon device from an exterior daughter card to another daughter card. As indicated by data in the 2004 Clink publication, this grouping strategy is effective for data rates less than 3.125 Gbps, but at higher data rates, the unshielded adjacent differential pair vias create a bottleneck in routers and switches. Side-by-side channel proximity tends to induce accumulated crosstalk between the signal pairs from the source area to the destination area or induce far-end crosstalk or forward crosstalk. Far-end crosstalk is defined as the accumulated crosstalk of coupled signal pairs over a defined distance.

As described in the 2003 Clink publication, there are some commonly practiced techniques employed by backplane designers to mitigate the severity of far-end crosstalk of adjacent channels. For instance, wherever possible, backplane designers attempt to "depopulate" the adjacent channels by assigning those adjacent channels to ground vias. Therefore, for severe crosstalk, the problem can be alleviated by assigning ground vias on every other pair for maximum channel isolation. One via would be assigned as a signal channel, and an adjacent via would be assigned as ground instead of a signal channel. When there is a long row of adjacent pairs, such as in daughter card slots, every other pair would be reassigned as ground vias. The advantage of this arrangement is that the alternating assignment provides a nearly ideal solution for channel isolation. A major disadvantage is that it exponentially reduces the number of available routing pairs in a printed circuit board. To recover the lost routing pairs, the number of signal layers is increased or the area of the printed circuit board panel is increased, resulting in greater overall cost of the printed circuit board. Higher costs may be unacceptable in cost sensitive systems.

Another commonly practiced technique used by backplane designers is described in "Investigating Microvia Technology for 10 Gbps and Higher Telecommunications Systems," Agilent White Paper—5989-2422EN, by Agilent Technologies, Inc. Agilent Technologies reduces via depths to reduce adjacent via crosstalk by use of short microvias. Vias are connected near the surface of the printed circuit board, instead of within the printed circuit board. Connecting near the surface reduces the via-to-via coupling, thereby minimizing far-end crosstalk. However, one disadvantage is that it is not possible to ideally route all adjacent pairs near the surface of the printed circuit board as the routing space in the layers close the surface are limited. Further, connecting only near the surface provides fewer connection points so that reducing crosstalk by alternating assignments to ground, the method described above, is not feasible.

Another method to mitigate far-end crosstalk is backdrilling, as discussed in "Practical Guidelines for the Implementation of Back Drilling Plated Through Hole Vias in Multi-Gigabit Board Applications," DesignCon 2003, by Tom Cohen. The DesignCon 2003 conference paper highlights the benefits of backdrilling in printed circuit boards. Backdrilling, also known as counterboring, may be necessary for particular applications, such as when vias are plated-through-holes. Without backdrilling, the unused portion of the plated-through-hole, also known as the resonant stub, acts as a notch filter centered around a frequency primarily determined by the length of the resonant stub. Therefore, as an electrical signal is transitioning through the plated-through-hole, some of the energy of the electrical signal is reflected back to the source because of the resonant stub. To mitigate the effects of the resonant stub, the plated-through-hole is backdrilled. The unused portion of the plated-through-hole is drilled out by boring into the unused portion of the plated-through-hole to remove the electrically conductive material disposed on the surface of the bore.

SUMMARY OF THE INVENTION

Accordingly, it is one object of the invention to provide an electrical signal connection, an electrical signaling system, and a method of connecting that minimizes crosstalk between adjacent traces.

An embodiment of the present invention provides an electrical signal connection between a first printed circuit board having a top surface and a second printed circuit board. The connection has a first conductive via and a second conductive via disposed in the first printed circuit board. A first conductive trace with a first end and a second end has the first end electrically coupled to the first conductive via at a first distance from the top surface of the first printed circuit board. The second end is electrically coupled to the second printed circuit board. A second conductive trace with a first end and a second end has the first end electrically coupled to the second conductive via at a second distance from the top surface of the first printed circuit board. The second end is electrically coupled to the second printed circuit board.

In accordance with another embodiment, the invention provides an electrical signaling system. A first conductive via and a second conductive via are disposed in a printed circuit board. An end of a first conductive trace is electrically coupled to the first conductive via at a first distance from a top surface of the printed circuit board. An end of a second conductive trace is electrically coupled to the second conductive via at a second distance from the top surface of the printed circuit board.

In accordance with yet another embodiment, the invention provides a method of connecting a first printed circuit board to a second printed circuit board. The first step is selecting a first conductive via disposed in the first printed circuit board. Then the first conductive via is coupled to an end of a first conductive trace. Next, an opposite end of the first conductive trace is coupled to a first corresponding conductive via disposed in the second printed circuit board. Then, an adjacent conductive via disposed in the first printed circuit board is selected. The adjacent conductive via is close to a conductive via already coupled to one end of a conductive trace. Then, determine a depth difference to minimize crosstalk between proximate conductive traces and couple the adjacent conductive via to an end of an adjacent conductive trace at the depth difference to minimize crosstalk. The adjacent conductive trace is near the coupled conductive trace. Then, an opposite end of the adjacent conductive trace is coupled to a second corresponding conductive via connection disposed in the second printed circuit. Finally, repeat with other adjacent vias and other adjacent traces until all desired connections are made.

Other objects, advantages and salient features of the invention will become apparent from the following detailed description, which, taken in conjunction with the annexed drawings, discloses a preferred embodiment of the present invention.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Referring to FIGS. 1-10, the present invention relates to an electrical signal connection that minimizes electromagnetic coupling or crosstalk between adjacent traces 110a-110c. Minimizing crosstalk decreases the distortions in signals transmitted by adjacent traces 110a-110c. Crosstalk is minimized by locating adjacent traces 110a-110c on different layers 108 of a printed circuit board 100. A distance between the adjacent traces 110a-110c is configured to minimize crosstalk of a certain frequency. As the distance is decreased, a higher frequency of crosstalk is minimized, and in a similar fashion, a larger distance results in minimizing crosstalk of a lower frequency. Also, if the distance between adjacent traces 110a-110c is configured for a particular frequency and the distance is maintained between adjacent traces 110a-110c, the adjacent traces 110a-110c can be located on any layer 108 and still minimize the crosstalk for that particular frequency.

Figure 1:
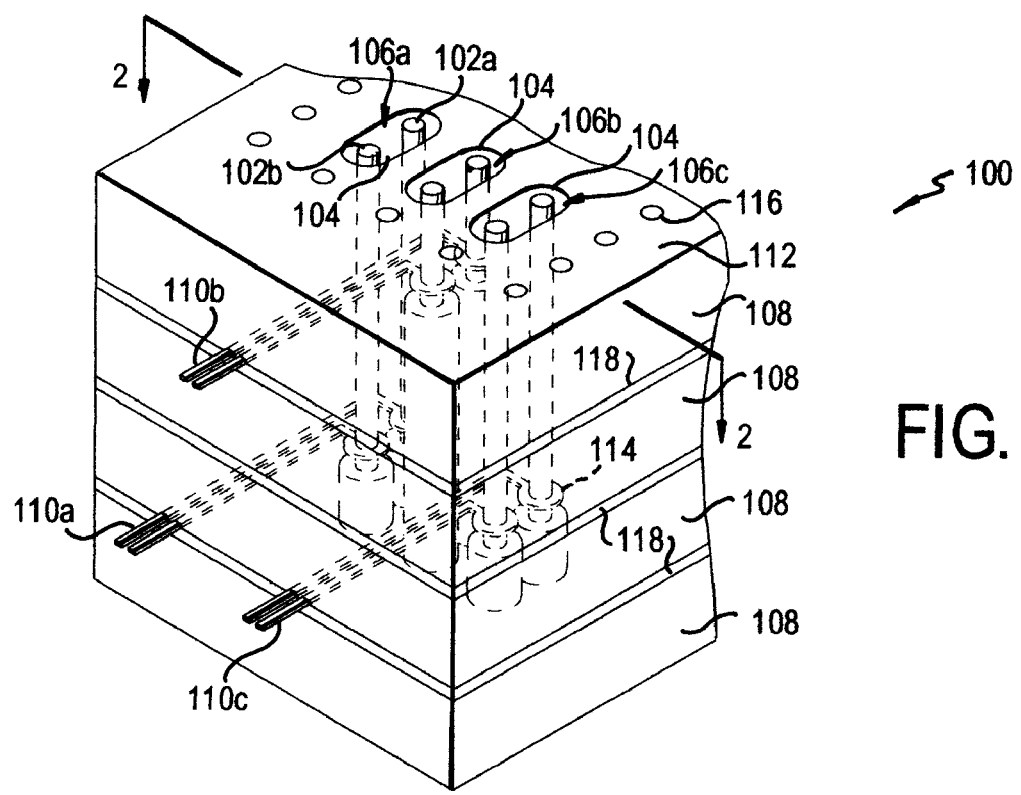
FIG. 1 is a perspective view of a signaling system in accordance with an embodiment of the invention.
Figure 3:
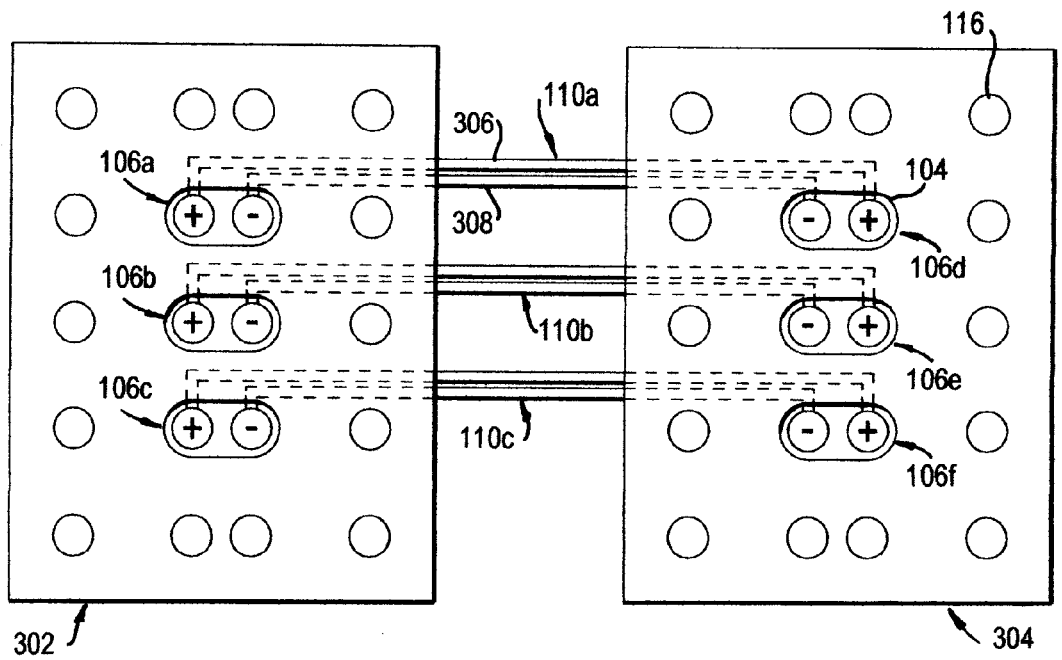
FIG. 3 is a top view of a set of adjacent vias configured as differential pairs attached to traces that lead to a second set of adjacent vias in the signaling system in accordance with an embodiment of the invention.

Referring to FIG. 1, a signaling system is shown. In accordance with a preferred embodiment, the signaling system is implemented in a printed circuit board 100. In FIG. 1, only a portion of the printed circuit board 100 is shown. The printed circuit board 100 includes plated-through-holes 102a-102b, anti-pads 104, adjacent vias 106a-106c, various layers or ground plates 108, traces 110a-110c, a surface 112, loops 114, surface pads 116, and dielectric layers 118. Only one end of each trace 110a-110c is shown, with the other end of the traces being connected to other vias of the same printed circuit board 100 or a different printed circuit board, such as shown in FIG. 3. Only three adjacent vias 106a-106c are shown for illustrative purposes but more or fewer vias 106 can be provided.

The printed circuit board 100 is preferably constructed of several ground plates 108 with dielectric layers 118 positioned between the ground plates 108. Each ground plate 108 provides a surface 112 for placing electrical components. As shown, several ground plates 108 may be provided one on top of one another with dielectric layers 118 in between to increase the number of electrical components that can be disposed on the printed circuit board 100. The vias 106a-106c are preferably disposed through each of the plates 108 and dielectric layers 118 to provide electrical connections between components located on different ground plates 108.

Each of the vias 106a-106c is configured to provide an electrical connection at various positions along its length. A trace 110a-110c is coupled to each of the vias 106a-106c at various positions along the length of each of the vias 106a-106c. An electrical signal from a component located at one section of the printed circuit board 100 can be sent across the vias 106a-106c and traces 110a-110c to another portion of the printed circuit board 100 or to a different printed circuit board. The vias 106a-106c are preferably constituted of two conductive plated-through-holes 102a-102b.

Traces 110a-110c provide an electrical signal pathway between two points. The traces 110 are comprised of an electrically conductive material and placed on or in the printed circuit board 100 by conventional methods. Traces 110a-110c can be adapted for electrical coupling at either end by conventional methods. Preferably, however, a loop 114 is formed at the end of each trace 110 and the loop connects to the respective via 106 for reliable electrical contact.

The surface pads 116 are attached to the vias 106, 120. The surface pad 116 is an electrically conductive material that is adapted for electrical coupling. The surface pads 116 preferably are circular members having a diameter that is larger than the diameter of the associated vias 106, 120 as shown in FIG. 1. The surface pads 116 are provided on both ends of the vias 106, 120 at the uppermost surface 112 and lowermost surface (not numbered) of the printed circuit board 100 preferably during electrolytic deposition, electrolytic plating process, or other similar coating process. The surface pads 116 sit on the ends of the vias 106, 120 and are electrically coupled to the vias 106, 120. The surface pads 116 ensure that the vias 106, 120 are anchored onto the printed circuit board 100 and facilitate connection of the vias 106, 120 to external devices. The ground vias 120 can be disposed adjacent to signal vias 106a-106c. The positioning of the ground vias 120 can be as discussed in the 2004 Clink publication noted above. Ground vias 120 are used when transferring high speed signals from an external electrical component to an internal printed circuit board layer 108.

The anti-pads 104 form an area without any conductive material around each signal via pair 106a-106c. During manufacturing of the printed circuit board 100, conductive material is deposited on a surface of a nonconductive material to form either the dielectric layers 118 or the ground plates 108. The anti-pads 104 are formed by removing the conductive layer from the nonconductive surface. Without the anti-pad 104, the conductive material would make contact with the vias 106a-106c, and signals from the vias 106a-106c would be short-circuited directly to ground thereby preventing signal propagation. The anti-pads 104 are preferably disposed on the surface of each ground layer 108. The anti-pads 104 can have any suitable shape and size other than the oval shape shown and can be made only about each individual via 106 rather than about each via pair. The anti-pad 104 must be sufficiently large in area so that the vias 106a-106c can pass through the dielectric layer 118 or the ground plate 108 without contacting conductive material on the surface thereof.

Figure 2:
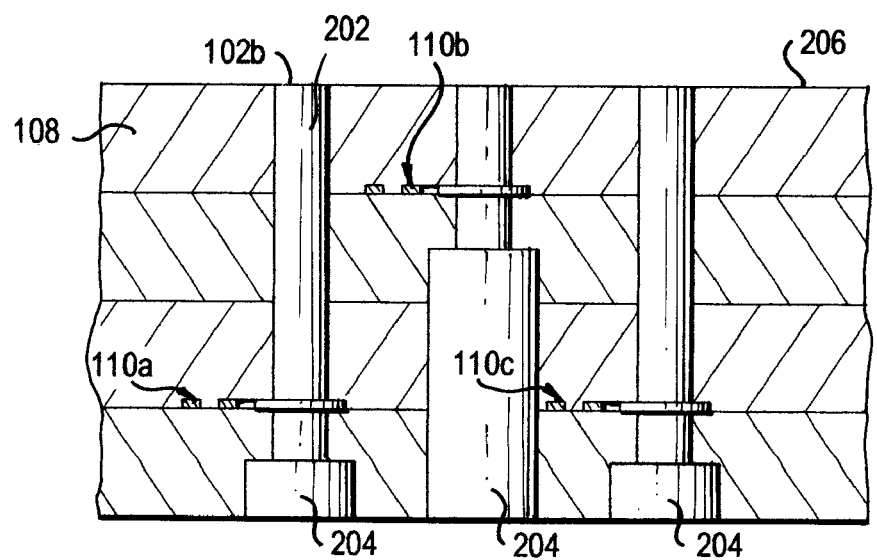
FIG. 2 is a cross-sectional plan view, taken along line 2-2 in FIG. 1, of the signaling system in accordance with an embodiment of the invention.

Referring to FIG. 2, a cross-sectional plan view is shown taken along line 2-2 in FIG. 1 of the portion of the printed circuit board 100. The plated-through-holes 102a-102b are formed by boring into at least one ground plate 108 in a stack of ground plates 108 and dielectric layers 118 that make up the printed circuit board 100. In the preferred embodiment, the plated-through-holes 102a-102b have a circular cross-section and are substantially orthogonal to the ground plate surface 112 for placing electrical components. However, other cross-sectional shapes may be used, and the plated-through-holes 102a-102b may extend non-orthogonally within ground plates 108 of the printed circuit board 100.

Electrically conductive material is then deposited on the internal surface of the bore 202, such as by electrolytic deposition, electrolytic plating process, or other similar coating process. The trace 110a-110c is then electrically coupled to the plated-through-hole 102a-102b by contacting the electrically conductive material deposited on the internal surface of the bore 202.

For the purposes of describing the invention and without intending to limit the invention, the position where the trace 110a-110c is coupled to the via 106a-106b is referred to as a "depth" and measured relative to the uppermost surface 206 of the printed circuit board 100. Thus, "depth" generally refers to the distance from the uppermost surface 206 of the printed circuit board 100 to the position where trace 110a-110c is coupled to the via 106a-106c. However, the term "depth" does not imply that the position where trace 110a-110c is coupled to the via 106a-106b must always be measured from the uppermost surface 206 of the printed circuit board 100. The depth at which a particular trace 110a-110c is connected to respective vias 106a-106c is not as critical as the fact that the depths of neighboring connection points are offset with respect to one another.

A backdrill 204 can be formed at one or both sides of the vias 106a-106c. Backdrilling is discussed in "Practical Guidelines for the Implementation of Back Drilling Plated Through Hole Vias in Multi-Gigabit Board Applications," DesignCon 2003, by Tom Cohen. The unused portion of the plated-through-hole 106 is drilled out by boring into the unused portion of the plated-through-hole 102a-102b to remove the electrically conductive material disposed on the surface of the bore 202. Without backdrilling, the unused portion of the plated-through-hole 102a-102b, or resonant stub, acts as a notch filter centered around a frequency primarily determined by the length of the resonant stub. The resonant stub causes some of the energy of an electrical signal that is transitioning through the plated-through-hole 102a-

102b to be reflected back to the source. Thus, the plated-through-hole 102a-102b is backdrilled to mitigate the effects of the resonant stub.

Referring to FIG. 3, a source area 302 is shown connected to a destination area 304 by traces 110a-110b. The source area 302 includes three adjacent vias 106a-106c, and the destination area 304 includes three adjacent vias 106d-106f. The source area 302 and the destination area 304 may be on the same printed circuit board. However, other alternatives are suitable. For instance, an embodiment can have more or fewer than three adjacent vias. Further, the source area 302 may be on one printed circuit board and the destination area 304 on another circuit board. Also, either side may be considered the source area 302 or the destination area 304.

The vias 106a-106f may be differential pairs of plated-through-holes 102a-102b. One plated-through-hole 102a or 102b of the via 106a-106f is the positive polarity of the electrical signal, while the other plated-through-hole 102a or 102b of the via 106a-106f is the negative polarity of the electrical signal. The orientation of the polarity assignments shown in FIG. 3 may be interchanged. For example, the polarity assignments shown in FIG. 3 may be reversed. When the plated-through-holes 102a-102b are configured to be differential pairs, then the traces 110a-110c connecting the plated-through-holes 102a-102b are made up of parallel conductors. Each trace 111a-110c has parallel conductors 306 and 308, one of which, for instance, conductor 306 connects the positive polarity plated-through-hole 102a or 102b on the source area 302 to the positive polarity plated-through-hole 102a or 102b on the destination area 304. The other conductor 308 connects the negative polarity plated-through-hole 102a or 102b on the source area 302 to the negative polarity plated-through-hole 102a or 102b on the destination area 304.

As further shown in FIG. 3, the vias 106a-106c are preferably arranged so that the positive polarity plated-through-holes 102a or 102b are aligned with one another and the negative polarity plated-through-holes 102a or 102b are aligned with one another. However, the vias 106a-106c can also be staggered so that they are not aligned.

Ground vias are preferably assigned such that they are adjacent to one or both polarities in vias 106a-106f. The ground vias may be inline with the positive polarity plated-through-hole 102a or 102b and negative polarity plated-through-hole 102a or 102b or staggered out of line. The positioning of the ground vias is chosen by conventional methods, such as discussed in the 2004 Clink publication noted above.

Figure 4:
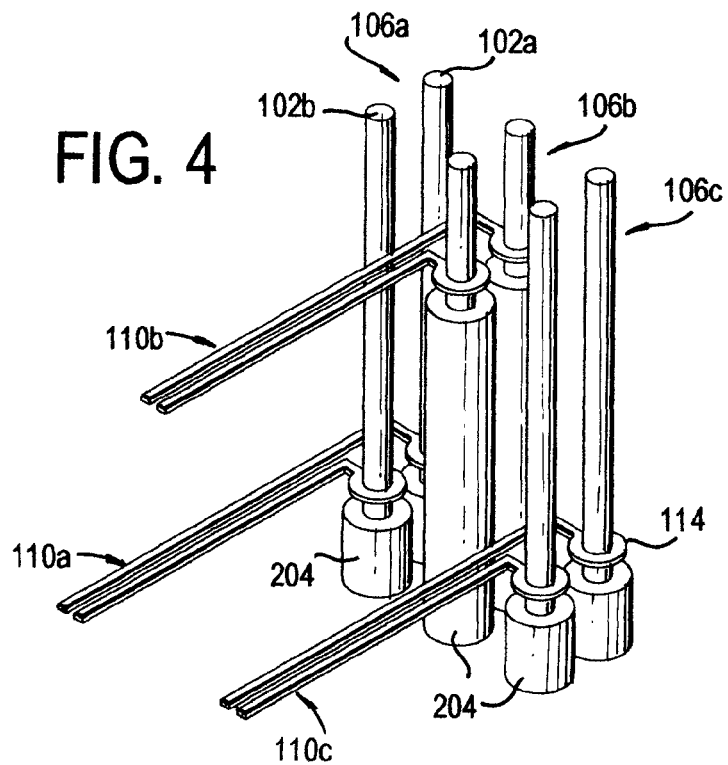
FIG. 4 is a perspective view of the signaling system in accordance with an embodiment of the invention without ground planes and surface pads for clarity.

Referring to FIG. 4, three adjacent vias 106a-106c are shown. For illustrative purposes, the ground plates 108 and ground vias placed in close proximity to 106a-106c are removed and only three adjacent vias 106a-106c are shown. Also, only one end of each of the three traces 110a-110c is shown. The vias 106a-106c are made up of a pair of plated-through-holes 102a-102b. Each trace 110a-110c is coupled to its respective via 106a-106c at different depths or distances along the length of the vias 106a-106c as measured from the uppermost surface 206 of the printed circuit board 100, instead of each trace 110a-110c being coupled to its respective via 106a-106c at the same respective depth.

Trace 110a is connected to via 106a at a certain depth. An adjacent trace 110b is connected to via 106b at another depth that is different from the depth at which trace 110a is connected to via 106a. Similarly, via 106c is connected to its trace 110c at yet another depth different from the depth where via 106b is connected to its trace 110b. Thus, the traces 110a-110c are offset with respect to each adjacent trace and with respect to the top surface of the printed circuit board 100.

Non-adjacent traces 110a and 110c are shown as being coupled to vias 106a and 106c respectively at the same depth, however, non-adjacent traces, such as traces 110a and 110c, can instead be coupled to their respective vias at different depths.

Accordingly, in the embodiment of FIG. 4, traces 110a-110c are coupled to the vias 106a-106c, respectively, at staggered depths, resulting in depth differences between adjacent vias 106a-106c. The depth difference, symbolized as Δ, is the difference in depths for coupling adjacent traces 110a-110c to their respective vias 106a-106c. The depth difference between where trace 110a couples to via 106a and where trace 110b couples to via 106b differs from the depth difference between where trace 110b couples to via 106b and where trace 110c couples to via 106c.

The depth difference provides suppression of accumulated crosstalk between the adjacent traces 110a-110c by suppressing certain areas of the accumulated crosstalk frequency spectrum. Coupling adjacent vias 106a and 106b with the depth difference different from the depth difference between adjacent vias 106b and 106c creates a cavity resonance effect thereby confining crosstalk energy between adjacent via pairs 106a and 106b and adjacent via pairs 106b and 106c. Consequently, a specific area of the crosstalk energy spectrum is filtered out where the cavity resonance frequency, or "null frequency", is in multiples of one-quarter wavelength. The approximate quarter-wavelength resonance frequency is determined according to the following mathematical equation:

$$f_{quarter\_null} = \frac{c}{4 \cdot \Delta \cdot \sqrt{\varepsilon_r}} \quad (1)$$

where c is $3 \times 10^8$ meters/sec (the speed of light); $\varepsilon_r$ is the relative dielectric constant; and Δ is the depth difference of adjacent vias in meters. Rearranging equation (1) mathematically to solve for the depth difference Δ results in:

$$\Delta = (4 \cdot f_{quarter\_null} \sqrt{\varepsilon_r})/c$$

Although equation (1) is valid for true cavity resonators, it can also be used for rough approximation of resonance frequencies in vias. Likewise, the next quarter-wavelength multiple, the half-wavelength resonance, is determined according to the following mathematical equation:

$$f_{half\_null} = \frac{c}{2 \cdot \Delta \cdot \sqrt{\varepsilon_r}} \quad (2)$$

where c is $3 \times 10^8$ meters/sec (the speed of light); $\varepsilon_r$ is the relative dielectric constant; and Δ is the depth difference of adjacent vias in meters. Rearranging equation (2) mathematically to solve for the depth difference Δ results in:

$$\Delta = (2 \cdot f_{half\_null} \sqrt{\varepsilon_r})/c$$

Since equation (1) can be used for rough approximation of resonance frequencies in the vias, an initial depth difference can be determined based on equation (1). Then the initial depth difference can be improved by numerical model analysis of the adjacent vias 106a-106b or 106b-106c. Numerical model analysis of adjacent vias with transmission lines attached must be used since adjacent vias with transmission lines attached between them cannot be solved by closed form equations or equations that can be evaluated in a finite number of standard mathematical operations. Various numerical models are available commercially and may even by created by one skilled in the relevant arts. Iterative solving of the numerical model improves the initial depth difference calculated by equation (1) and provides a predetermined depth difference that can be implemented in the invention.

The cavity resonance frequency can be optimized for a certain frequency by adjusting the depth difference, Δ, of adjacent differential pair vias 106a and 106b and adjacent differential pair vias 106b and 106c thereby filtering the desired portion of the far-end crosstalk energy spectrum. This arrangement is achieved provided that: (1) the differential pair via stubs are backdrilled to minimum stub depth thereby minimizing self-resonances and (2) the adjacent trace 110a-110c lengths are of approximately matched length.

Figure 5:
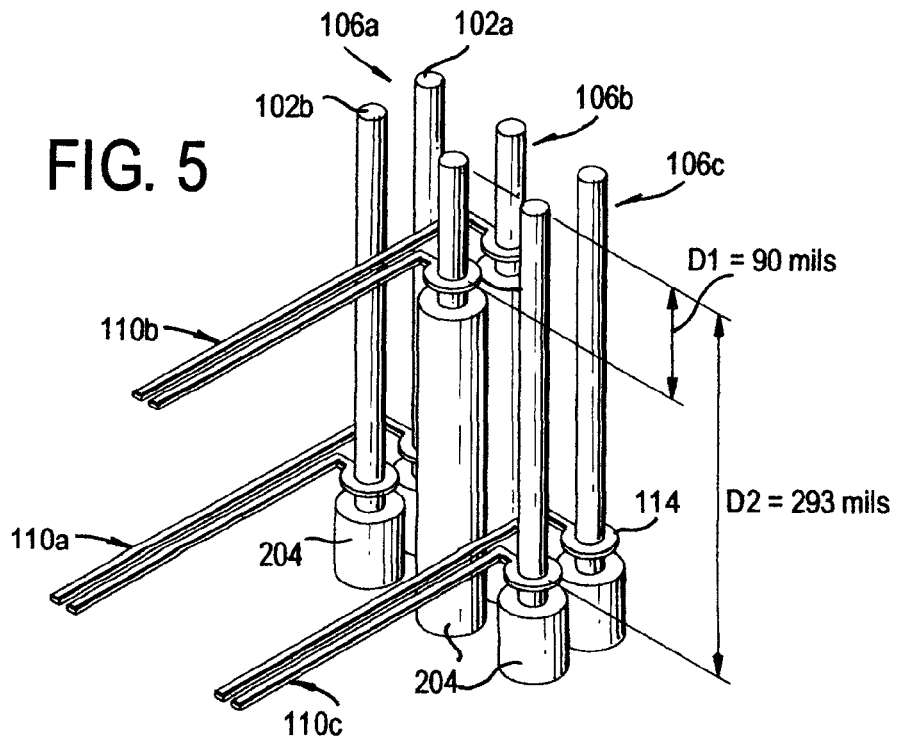
FIG. 5 is a perspective view of the signaling system in accordance with an embodiment of the invention without ground planes and surface pads for clarity where a depth difference is 5.16 mm (203 mils)

Referring to FIG. 5, the vias 106a and 106c are coupled to traces 110a and 110c at a depth D2 of 7.44 mm (293 mils) as measured from the uppermost surface 206 of the printed circuit board 100. The via 106b is coupled to trace 110b at a depth D1 of 2.29 mm (90 mils), also measured from the uppermost surface 206 of the printed circuit board 100. Thus, the depth difference between adjacent vias 106a and 106b, namely the difference between D1 and D2, is Δ=5.16 mm (203 mils).

Figure 6:
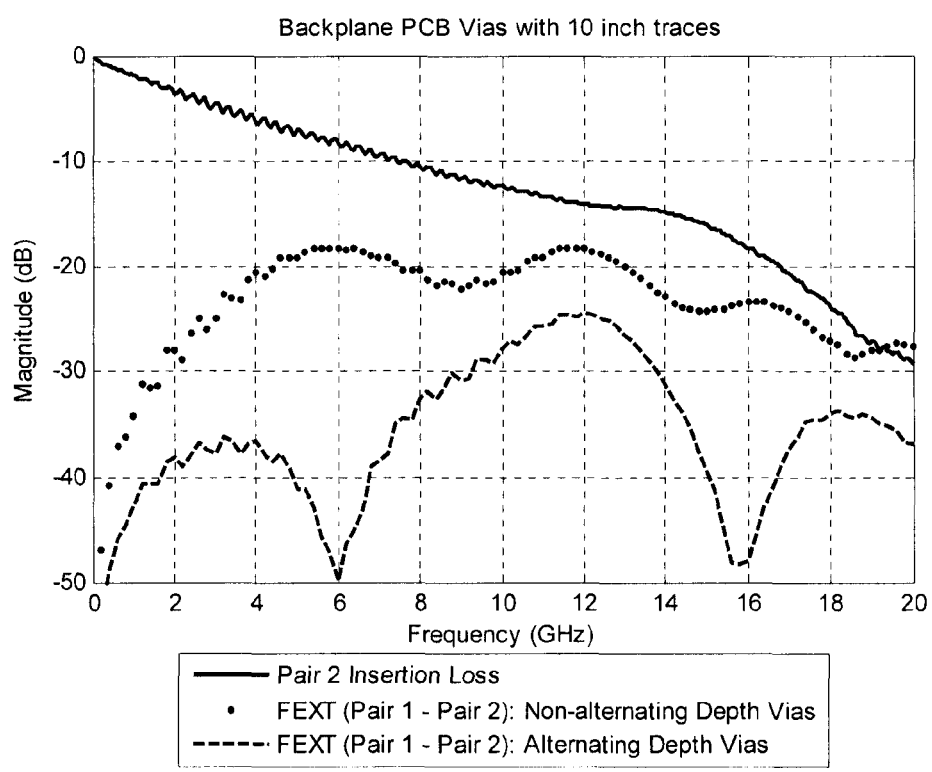
FIG. 6 is a frequency domain plot of insertion loss, far-end crosstalk for a signaling system without alternating couplings, and the embodiment shown in FIG. 5.

Referring to FIG. 6, a frequency plot is shown for the configuration of FIG. 5. The plot depicts signal magnitude as a function of increasing frequency. The frequency plot is based on the behavior of a field solver model of three pairs of differential vias. Field solver models are discussed, for instance, in the 2003 Clink publication noted above. In the field solver model, vias 106a-106c in the source area 302 are cascaded together with traces 110a-110c made up of one-hundred ohm transmission lines to vias 106d-106f in the destination area 304. Each trace 110a-110c has a length of 381 mm (15 inches). The dielectric constant of the printed circuit board dielectric in the field solver model is $\in_r$=3.75. The vias 106a-106f are composed of differential pairs of plated-through-holes 102a-102b and coupled to their respective traces 110a-110c at the depth of 7.44 mm (293 mils). Then, the plated-through-hole 102a-102b is backdrilled 0.58 mm (22.8 mil).

The solid line on the frequency plot represents the insertion loss of each trace 110a-110c. The insertion loss is a measure of attenuation of the signal amplitude along each trace 110a-110c. The dotted line represents the far-end crosstalk for vias 106a-106c coupled to traces 110a-110c at the same respective depths. The crosstalk plotted accounts only for noise in a backplane. It does not consider cumulative noise effects in backplane connectors, daughter card vias, silicon devices, and other similar sources of noise.

The dashed line represents the far-end crosstalk for traces 110a-110c coupled to respective vias 106a-106c at different depths. The crosstalk plotted also accounts only for noise in the backplane and does not consider cumulative noise effects. The dashed line is based on the embodiment shown in FIG. 5 where the Δ is 5.16 mm (203 mils). The, the predicted far-end crosstalk quarter-wavelength and half-wavelength null frequencies using equations (1) and (2), or the frequencies at which crosstalk is predicted to be most suppressed, are approximately 7.5 GHz and 15 GHz, respectively. The simulated null frequencies are at approximately 6 GHz and 15.5 GHz, as shown on the frequency plot. The simulated null frequencies are where the dashed line touches the bottom of the plot. The results of using equations (1) and (2), 7.5 GHz and 15 GHz, approximately predict the simulated null frequencies of 6 GHz and 15.5 GHz, shown in FIG. 6, thereby demonstrating that the two null frequencies are in multiples of a one-quarter wavelength.

The quality of high-speed differential backplane channels is often measured by its signal-to-noise margin. The signal-to-noise margin can be determined from the frequency plot. A vertical separation between the insertion loss line and the crosstalk line is the signal-to-noise margin. A wider vertical separation on the frequency plot indicates lower signal distortion, but low or nonexistent separation indicates severe signal distortion.

For instance, if the field solver model was a backplane channel operating at a data rate of 6.25 Gbps, then most of the spectral energy is centered at a frequency equal to approximately one-half the data rate of 6.25 Gbps or 3.125 GHz. On the chart of FIG. 6, at 3.125 GHz, the insertion loss is approximately −5 dB, or the solid line at a frequency of 3.125 GHz corresponds to a magnitude of −5 dB. At the same frequency, the far-end crosstalk for traces 110a-110c coupled to vias 106a-106c at the same depths is approximately −25 dB or at 3.125 GHz, the dotted line corresponds to a magnitude of −25 dB. So, the signal-to-noise margin at 3.125 GHz is about 20 dB, which is the difference in magnitudes between the solid line and dotted line or the vertical separation between the solid line and dotted line. A signal-to-noise margin of about 20 dB may be acceptable depending on the backplane system architecture. It is possible, however, that other noise sources outside of the backplane may consume most of that 20 dB margin.

Next generation backplane systems are geared towards data rates of 10+ Gbps where spectral energy content is centered at 5 GHz and beyond. On the chart of FIG. 6, for 5 GHz, the backplane channel exhibits a signal-to-noise margin of approximately 12 dB. As the frequency increases above 5 dB, the signal-to-noise margin becomes less than 12 dB. Thus, the example backplane channel is unsuitable for next generation systems because the small signal-to-noise margin would likely be consumed by outside noise sources.

Further, as shown on the frequency plot of FIG. 6, the embodiment shown in FIG. 5 where Δ=5.16 mm (203 mils) has significantly improved signal-to-noise margin. The depth difference of 5.16 mm (203 mils) was chosen to better support 6.25 Gbps and 10 Gbps operation. For 6.25 Gbps and 10 Gbps operation, spectral energy is centered at a frequency equal to approximately half the data rate or 3.125 GHz and 5 GHz, respectively. By coupling traces 110a-110c to vias 106a-106c at different positions, instead of coupling traces 110a-110c to vias 106a-106c at the same respective positions, the signal-to-noise margin at 3.125 GHz for 6.25 Gbps operation increases from 20 to 32 dB. Similarly, the margin at 5 GHz for 10 Gbps operation increases from 12 dB to 34 dB. Furthermore, resonance also tends to "pull down" neighboring spectral content thereby suppressing the entire far-end crosstalk spectrum.

Figure 7:
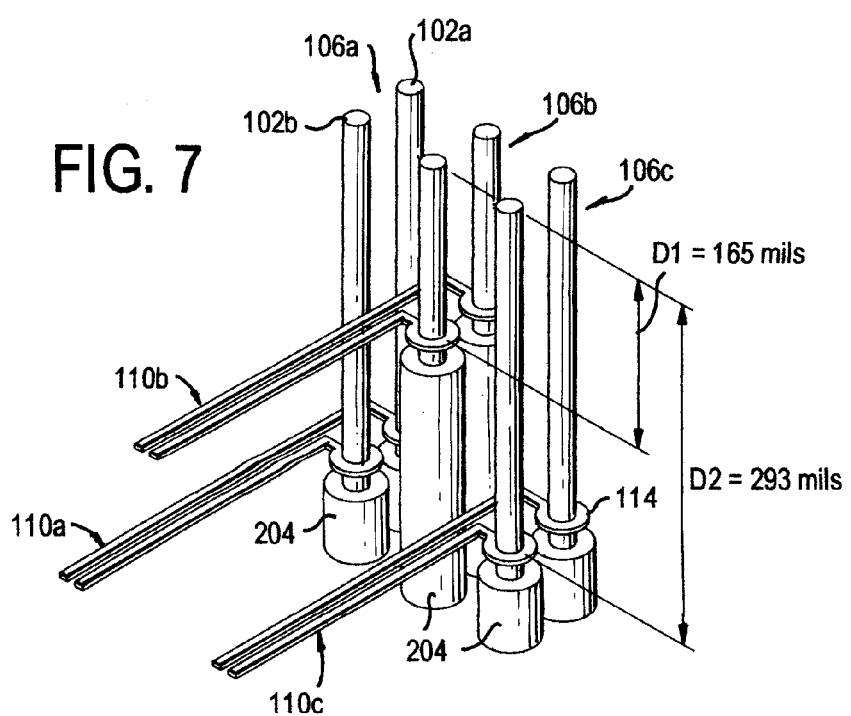
FIG. 7 is a perspective view of the signaling system in accordance with an embodiment of the present invention, with ground planes and surface pads hidden for clarity, where the depth difference is 3.25 mm (128 mils)

Referring to FIG. 7, the depth difference Δ is smaller than the embodiment shown in FIG. 5. The vias 106a and 106c are coupled to traces 110a and 110c so that depth D2=7.44 mm (293 mils). Via 106b is coupled to trace 110b at depth D1=4.19 mm (165 mils). Thus, the depth difference is 3.25 mm (128 mils) or Δ=3.25 mm (128 mils), smaller Δ than in FIG. 5 (7.44 mm (293 mils)).

Adjusting the depth difference, Δ, of adjacent differential pair vias 106a-106c, shifts the quarter-wavelength null frequencies in the far-end crosstalk energy spectrum. Thus, better signal-to-noise margins can be provided around a particular frequency. If the quarter and half-wavelength null frequencies need to be increased so as to provide better signal-to-noise margin at higher data rates, then depth difference, Δ, should be decreased.

For the embodiment shown in FIG. 7, the depth D2 for coupling traces 110a and 110c to vias 106a and 106c is the same as in the embodiment shown in FIG. 5 (7.44 mm (293 mils)). The depth D1 for coupling trace 110b to via 106b was moved deeper with respect to the uppermost surface 206 from depth D1 of 2.29 mm (90 mils) to 4.19 mm (165 mils), as can be seen by comparing FIG. 5 and FIG. 7. Using, equation (1), for Δ=3.25 mm (128 mils), the theoretical quarter-wavelength resonance occurs at approximately 12 GHz instead of 6 GHz as for Δ=5.16 mm (203 mils).

Figure 8:
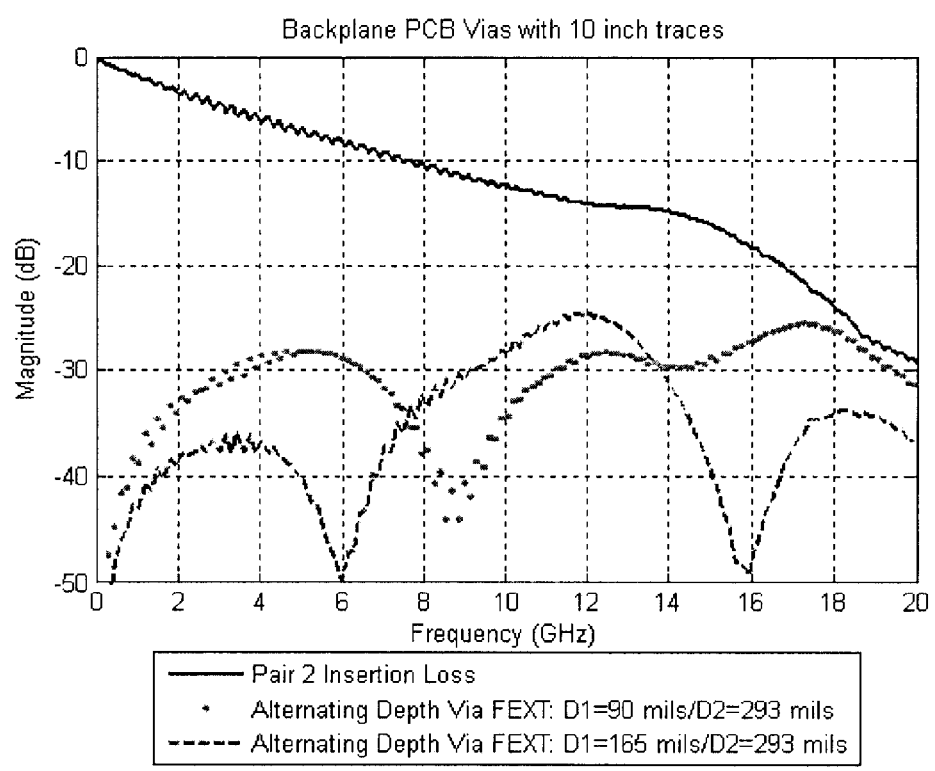
FIG. 8 is a frequency domain plot of insertion loss, the far-end crosstalk of the embodiment shown in FIG. 5, and the far-end crosstalk of the embodiment shown in FIG. 7.

Referring to FIG. 8, a frequency plot is shown with simulation results for the two embodiments shown in FIG. 5 and FIG. 7. The plot depicts signal magnitude as a function of increasing frequency. The frequency plot is again based on the behavior of the field solver model previously discussed where the vias 106a-106c in the source area 302 are connected by the traces 110a-110c to the vias 106d-106f in the destination area 304. As before, each trace 110a-110c is a one-hundred ohm transmission line with a length of 381 mm (15 inch), and the dielectric constant of the printed circuit board dielectric is 3.75.

The solid line on the frequency plot represents the insertion loss of each trace 110a-110c, which is the same as in FIG. 6. The dotted line represents the far-end crosstalk for the embodiment shown in FIG. 7 as determined by using the field solver model where Δ=3.25 mm (128 mils). The crosstalk plotted accounts only for noise in a backplane, and as before, it does not consider cumulative noise effects. The simulated null frequency is at approximately 9 GHz.

The dashed line on the frequency plot represents the far-end crosstalk for the embodiment shown in FIG. 5 where Δ=5.16 mm (203 mils). As before, the crosstalk plotted accounts only for noise in a backplane and does not consider cumulative noise effects. The simulated null frequencies are at approximately 6 and 15.5 GHz.

By lowering the depth difference from Δ=203 mils (5.16 mm) to Δ=128 mils (3.25 mm), the quarter-wave null for decreased Δ shifted up from approximately 6 GHz to approximately 9 GHz, as shown on FIG. 8, by comparing the dotted line to the dashed line. Thus by adjusting the Δ, the quarter-wave null frequency can be adjusted to a particular frequency. By using the field solver model and adjusting the depth difference Δ to a smaller value, the resonance frequency can be fine-tuned to get the desired null frequencies.

By coupling the trace 110b to the via 106b at depth D1=4.19 mm (165 mils) instead of depth D1=2.29 mm (90 mils) as measured from the uppermost surface 206 of the printed circuit board 100, the signal-to-noise margin is reduced due to adjacent vias 106a-106c being closer to one another. Although the signal-to-noise margin was reduced, moving the quarter-wavelength null up to a higher frequency does tend to flatten out the crosstalk spectrum up to 12 GHz where the signal-to-noise margin is still 10 dB better than when traces 110a-110c are coupled to vias 106a-106c at the same respective positions along their length.

Figure 9:
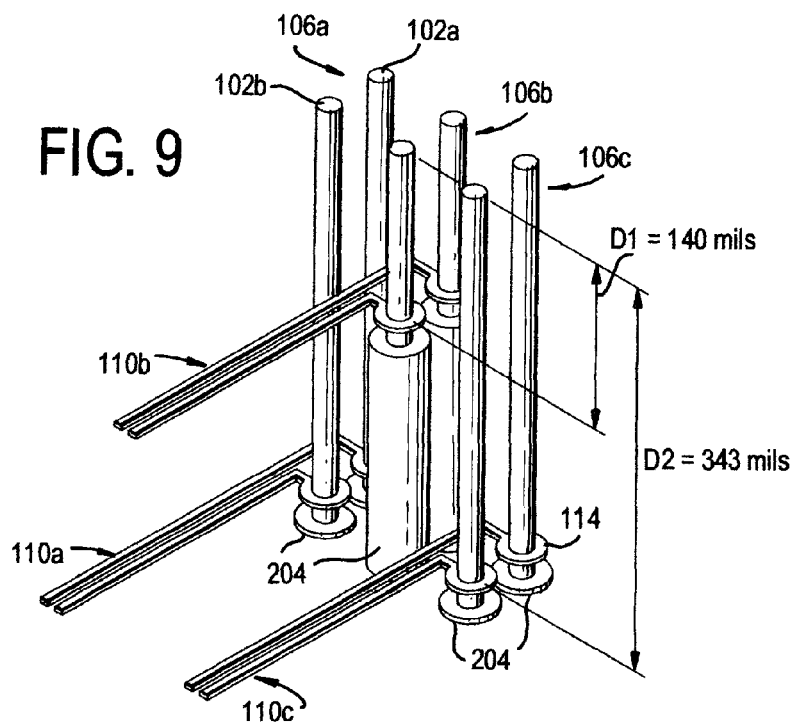
FIG. 9 is a perspective view of the signaling system in accordance with an embodiment of the present invention, with ground planes and surface pads hidden for clarity, where the depth difference is 5.16 mm (203 mils) but trace couplings are translated downward by an additional 1.27 mm (50 mils)

Referring to FIG. 9, another embodiment of the invention is shown. The depth difference Δ is the same as the embodiment shown in FIG. 5, or Δ=5.15 mm (293 mils). However, the traces 110a-110c are now connected to vias 106a-106c at depths D1 and D2 deeper than the embodiment shown in FIG. 5. The traces 110a and 110c are coupled to the vias 106a and 106c at the depth D2 of 8.71 mm (343 mils). The trace 110b is coupled to the via 106b at the depth D1 of 3.56 mm (140 mils).

Along with the ability to tune the null frequency by varying the depth difference, another advantage is the scalability of the staggered positions. In the embodiment shown in FIG. 9, Δ=5.15 mm (203 mils), which is the same as the embodiment shown in FIG. 5, but the coupling depths are translated down by an additional 1.27 mm (50 mils). At depths D1 and D2 of 3.56 mm (140 mils) and 8.71 mm (343 mils), respectively, the resulting quarter-wave resonance is similar to the one for the embodiment shown in FIG. 5, even though the traces 110a-110c are coupled to the vias 106a-106c deeper than the embodiment shown in FIG. 5.

Figure 10:
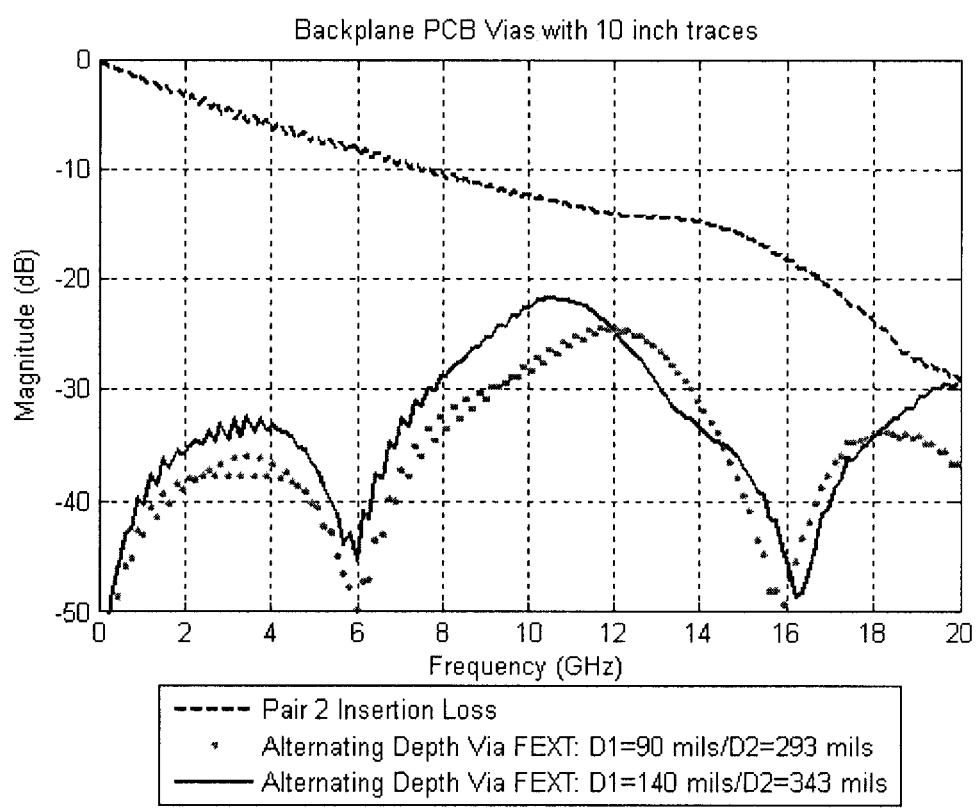
FIG. 10 is a frequency domain plot of insertion loss, the far-end crosstalk of the embodiment shown in FIG. 5, and the embodiment shown in FIG. 9.

Referring to FIG. 10, a frequency plot is shown with simulation results for the two embodiments shown in FIG. 5 and FIG. 9. The frequency plot is again based on the same field solver model as in FIG. 6 and FIG. 8. The dashed line on the frequency plot represents the insertion loss of each trace 110a-110c, same as in FIG. 6 and FIG. 8. The dotted line represents the far-end crosstalk of the embodiment shown in FIG. 5 using the field solver model with Δ=5.16 mm (203 mils). The crosstalk plotted accounts only for noise in a backplane. The simulated null frequencies are at approximately 6 GHz and 15.5 GHz, same as in FIG. 6. The solid line represents the far-end crosstalk for the embodiment shown in FIG. 9 where the coupling depths D1 and D2 are 2.29 mm (90 mils) and 7.44 mm (293 mils), respectively, so that Δ=5.16 mm (203 mils). It also accounts only for noise in the backplane.

The simulated far-end crosstalk in FIG. 10 shows that the embodiment shown in FIG. 5 and the embodiment shown in FIG. 9 both exhibit nearly identical null frequencies. The far-end crosstalk for the embodiment shown in FIG. 9 is approximately 5 dB higher than the embodiment shown in FIG. 5 due to increased via exposure. However, the signal-to-noise margin is still considerably improved over coupling traces 110a-110c to vias 106a-106c at non-staggered depths. Thus, designers are not confined to only two distinct depths. They can couple traces 110a-110c to vias 106a-106c at any depth as long as the predetermined depth difference is maintained. Thus, the ability to couple traces at any depth increases the available amount of routing area.

As described above, adjacent traces are coupled to adjacent vias at different positions along the length of the vias to minimize crosstalk between the adjacent traces, provided that differential pair stubs are backdrilled to minimum stub depth and adjacent traces are of approximately matched length. The coupling position has a depth that is measured relative to the top surface of the printed circuit board, and the difference in coupling depths between adjacent traces defines a depth difference. By reducing the depth difference, the frequency at which crosstalk is suppressed shifts to a higher frequency. Also, for a particular frequency of crosstalk suppression, adjacent traces can be coupled at any depth as long as the depth difference between adjacent traces is maintained. By suppressing crosstalk between adjacent traces, the present invention minimizes distortions in signals transmitted by adjacent traces.

While particular embodiments have been chosen to illustrate the invention, it will be understood by those skilled in the art that various changes and modifications can be made therein without departing from the scope of the invention as defined in the appended claims.

What is claimed is:

1. An electrical signal connection between a first printed circuit board having a top surface and a second printed circuit board, said connection comprising:

a first conductive via disposed in said first printed circuit board;

a second conductive via disposed in said first printed circuit board;

a first conductive trace having a first end and a second end, said first end being electrically coupled to said first conductive via at a first distance from the top surface of the first printed circuit board, said second end being electrically coupled to said second printed circuit board; and a second conductive trace having a first end and a second end, said first end being electrically coupled to said second conductive via at a second distance from the top surface of the first printed circuit board, said second end being electrically coupled to said second printed circuit board, wherein said first distance is different than said second distance.

2. The electrical signal connection according to claim 1, wherein said first conductive via is proximate to said second conductive via.

3. The electrical signal connection according to claim 1, wherein said first conductive trace is proximate to said second conductive trace.

4. The electrical signal connection according to claim 1, wherein said first conductive trace is a wire.

5. The electrical signal connection according to claim 1, wherein said first conductive trace is an etched pathway.

6. The electrical signal connection according to claim 1, wherein said second conductive trace is a wire.

7. The electrical signal connection according to claim 1, wherein said second conductive trace is an etched pathway.

8. The electrical signal connection according to claim 1, wherein said first conductive via and said second conductive via each comprise differential pair plated-through-holes and said first conductive trace comprises two differential traces.

9. The electrical signal connection according to claim 8, further comprising at least one ground via disposed adjacent to the first or second conductive via.

10. The electrical signal connection according to claim 1, wherein said first conductive via and said second conductive via comprise backdrilled plated-through-holes.

11. The electrical signal connection according to claim 1, wherein said first conductive trace and said second conductive trace are of substantially matched length.

12. The electrical signal connection according to claim 1, further comprising a depth difference between said first distance and said second distance, said depth difference set to minimize crosstalk between said first conductive trace and said second conductive trace.

13. The electrical signal connection according to claim 12, wherein said depth difference is determined by iterative solutions of a numerical model of the electrical connection having an initial depth difference determined by the mathematical equation:

$$\Delta = (4 \cdot f_{quarter\ null} \sqrt{\in_r})/c$$

where $\Delta$ = said initial depth difference in meters, $\in_r$ = relative dielectric constant of a printed circuit board dielectric, and $c = 3 \times 10^8$ meters/sec.

14. The electrical signal connection according to claim 1, wherein said first and second conductive vias extend at least partly through said first printed circuit board.

15. The electrical signal connection according to claim 1, further comprising:

a third conductive via disposed on said second printed circuit board, said second end of said first conductive trace being electrically coupled to said third conductive via at said first distance; and a fourth conductive via disposed on said second printed circuit board, said second end of said second conductive trace being electrically coupled to said fourth conductive via at said second distance.

16. An electrical signaling system comprising:

a first conductive via disposed in a printed circuit board;

a second conductive via disposed in said printed circuit board;

a first conductive trace having an end electrically coupled to said first conductive via at a first distance from a top surface of the printed circuit board; and a second conductive trace having an end electrically coupled to said second conductive via at a second distance from the top surface of the printed circuit board, where said first and second distances defining a depth difference between said first distance and said second distance, said depth difference set to minimize crosstalk between said first conductive trace and said second conductive trace.

17. The electrical signaling system according to claim 16, wherein said first conductive via is proximate to said second conductive via.

18. The electrical signaling system according to claim 16, wherein said first conductive trace is proximate to said second conductive trace.

19. The electrical signaling system according to claim 16, wherein said first conductive trace is a wire.

20. The electrical signaling system according to claim 16, wherein said first conductive trace is an etched pathway.

21. The electrical signaling system according to claim 16, wherein said second conductive trace is a wire.

22. The electrical signaling system according to claim 16, wherein said second conductive trace is an etched pathway.

23. The electrical signaling system according to claim 16, wherein said first conductive via and said second conductive via comprise differential pair plated-through-holes.

24. The electrical signaling system according to claim 16, wherein said first conductive via and said second conductive via comprise backdrilled plated-through-holes.

25. The electrical signaling system according to claim 16, wherein said first conductive trace and said second conductive trace are of substantially matched length.

26. The electrical signaling system according to claim 16, wherein said depth difference is determined by iterative solutions of a numerical model of the electrical signaling system having an initial depth difference determined by the mathematical equation:

$$\Delta = (4 \cdot f_{quarter\ null} \sqrt{\in_r})/c$$

where $\Delta$ = said initial depth difference in meters, $\in_r$ = relative dielectric constant of a printed circuit board dielectric, and $c = 3 \times 10^8$ meters/sec.

27. The electrical signal connection according to claim 16, further comprising at least one ground via disposed adjacent to the first or second conductive via.

28. An electrical signal connection between a first printed circuit board having a to surface and a second printed circuit board, said connection comprising:

a first set of differential pair plated through-holes disposed in said first printed circuit board;

a second set of differential pair plated through-holes disposed in said first printed circuit board; a first differential pair of traces, each of the first differential pair of traces having a first end and a second end, said first end being electrically coupled to said first conductive via at a first distance from the to surface of the first printed circuit board, said second end being electrically coupled to said second printed circuit board; and a second differential pair of traces, each of the second differential pair of traces having a first end and a second end, said first end being electrically coupled to said second conductive via at a second distance from the to surface of the first printed circuit board, said second end being electrically coupled to said second printed circuit board.

29. The electrical signal connection according to claim 28, wherein said first conductive via is proximate to said second conductive via.

30. The electrical signal connection according to claim 28, wherein said first conductive trace is proximate to said second conductive trace.

31. The electrical signal connection according to claim 28, wherein said first conductive trace is a wire.

32. The electrical signal connection according to claim 28, wherein said first conductive trace is an etched pathway.

* * * * *